(12) United States Patent
Suh

(10) Patent No.: US 7,266,032 B2
(45) Date of Patent: Sep. 4, 2007

(54) MEMORY DEVICE HAVING LOW VPP CURRENT CONSUMPTION

(75) Inventor: Jungwon Suh, Apex, NC (US)

(73) Assignee: Infineon Technologies AG, Munich (DE)

(*) Notice: Subject to any disclaimer, the term of this patent is extended or adjusted under 35 U.S.C. 154(b) by 69 days.

(21) Appl. No.: 11/240,333

(22) Filed: Sep. 30, 2005

(65) Prior Publication Data

US 2007/0076504 A1  Apr. 5, 2007

(51) Int. Cl.
  *G11C 7/00* (2006.01)
(52) U.S. Cl. .............. 365/222; 365/149; 365/150; 365/230.03; 365/233
(58) Field of Classification Search ............ 365/222, 365/149, 150, 230.03, 233
  See application file for complete search history.

(56) References Cited

U.S. PATENT DOCUMENTS

| 4,758,993 A | 7/1988 | Takemae |
| 4,933,907 A | 6/1990 | Kumanoya et al. |
| 5,251,176 A | 10/1993 | Komatsu |
| 5,631,872 A | 5/1997 | Naritake et al. |
| 5,822,264 A | 10/1998 | Tomishima et al. |
| 5,999,472 A * | 12/1999 | Sakurai ............ 365/222 |
| 6,570,801 B2 | 5/2003 | Yoshida et al. |
| 6,914,841 B1 | 7/2005 | Thwaite |
| 6,934,211 B2 | 8/2005 | Hazama et al. |
| 6,982,917 B2 | 1/2006 | Lee et al. |
| 7,095,670 B2 * | 8/2006 | Lee et al. ......... 365/222 |
| 7,170,808 B2 | 1/2007 | Hokenmaier |
| 2002/0186598 A1 | 12/2002 | Ooishi |

OTHER PUBLICATIONS

PCT International Search Report and Written Opinion dated Dec. 19, 2006.

* cited by examiner

Primary Examiner—Richard T. Elms
Assistant Examiner—Pho M. Luu
(74) Attorney, Agent, or Firm—Patterson & Sheridan, L.L.P.

(57) ABSTRACT

A method of performing a self refresh of memory cells in a memory device. The memory device includes a first group of cell blocks and a second group of cell blocks and each cell block of the first group shares at least one sense amplifier with a cell block of the second group. The method includes simultaneously activating each cell block of the first group. While the cell blocks of the first group are activated, each memory cell in the first group is refreshed. The method further includes simultaneously activating each cell block of the second group. While the cell blocks of the second group are activated each memory cell in the second group is refreshed.

17 Claims, 8 Drawing Sheets

MEMORY DEVICE HAVING LOW VPP CURRENT CONSUMPTION

BACKGROUND OF THE INVENTION

1. Field of the Invention

The invention generally relates to memory devices and, more particularly, to reducing current consumption during refresh operations.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices.

DRAM devices utilize memory cells (also referred to as storage nodes) consisting of one transistor and one capacitor. The cells are accessed by activating a wordline, switching on the respective transistors and coupling the respective capacitors to a bit line. The stored charge on the capacitor is then sensed by a sense amplifier coupled to the bit line to determine if a logical '1' or '0' bit of data is stored in the accessed cell.

Due to leakage current, charge stored in the capacitors may be lost to the point that the corresponding data is no longer valid. As a result, DRAM devices need refresh operations to maintain their stored data. Refresh operations are typically performed at regular time intervals by means of activating a word line, or a number of word lines, followed by a pre-charge of the same word line or word lines. This operation is repeated for the next word line or set of word lines until the whole chip is refreshed. Modern DRAM devices determine the word-line address for each refresh operation internally. Each refresh operation is initiated either externally, by means of an external command (e.g., a CAS before RAS or "CBR" refresh command) or internally when the device is in a "self refresh mode" or similar "standby"-like mode.

To optimize access to storage cells (e.g., to speed access, simplify signal routing, and/or facilitate layout), wordlines are segmented into groups of local wordlines or "wordline segments," in which the collective segments are controlled by master wordlines. A master wordline and the local wordlines accessed by the master wordline may be referred to together as segmented wordlines. The local wordlines may be activated by activating the controlling master wordline for the group and asserting a signal on a control line for a local word line driver. In some cases, master wordlines and associated local wordlines may be further grouped into cell blocks which may be activated each time a master wordline and local wordline with a given cell block are accessed.

FIG. 1 is a timing diagram which depicts an exemplary timing of control signals applied during a self refresh mode to a memory device having cell blocks, master wordlines, and local wordlines. At time $T_0$, the memory device may be operating in a normal mode wherein requested memory accesses (reads, writes, and refreshes) are being performed on the basis of an external clock signal, CLK. At time $T_1$, the clock enable signal CKE may be lowered, thereby disabling the clock signal CLK. At time $T_2$, a self refresh of the memory device may be initiated and the self refresh signal SREF may be asserted.

When the self refresh signal SREF is asserted, a timer, referred to as the self refresh timer (or self refresh oscillator) may begin generating a self refresh clock signal SREF_OSC which may be used to time row activations and precharges during the self refresh. Thus, at time $T_3$, and continuing for the duration of the self refresh, SREF_OSC may be asserted periodically. The period of the SREF_OSC signal is referred to as the self refresh interval, tSRFI.

Each time SREF_OSC is asserted, a row address from a row address counter (RAC) may be used to select a cell block, a master wordline, and a local wordline for the row of memory cells to be refreshed. The high order bits of RAC may be used to select a cell block (indicated by the signal MUX), bits in the middle of RAC may be used to select a master wordline (indicated by Word Line <0:i+n>), and the lower order bits of RAC may be used to select a local wordline (indicated by MWLRST<0:3>). In the exemplary case depicted, there may be 16 cell blocks in a memory bank, 128 master wordlines in each cell block, and 4 local wordlines controlled by each master wordline. A signal (MDQS) used to connect local data lines to master data lines and secondary sense amplifiers in the memory device may also be asserted during each cycle.

When the self refresh begins at time $T_3$, RAC may address 0, for example. Thus, the memory cells accessed using local wordline 0 and master wordline 0 in cell block 0 may be refreshed first. After each row of memory cells is refreshed, RAC may be incremented to access the next row. Thus, at time $T_4$, the next local wordline (local wordline 1) and master wordline 0 in block 0 may be activated to perform a refresh of the associated memory cells. After local wordlines 0-3 controlled by master wordline 0 have been refreshed, the next master wordline (master wordline 1) and local wordline (local wordline 0) may be accessed to perform a refresh of the associated memory cells.

The refresh cycles for cell block 0 may be continued until the memory cells accessed by the local wordlines for the 128 master wordlines of the cell block 0 have been refreshed, at time $T_5$. Thus, to refresh an entire cell block, 512 SREF_OSC cycles may be required (4 local wordlines*128 master wordlines=512). Then, beginning at time $T_6$, the self refresh may continue with master wordline 0 and local wordline 0 in cell block 1 (as specified by the high order bits of RAC; again, indicated by the signal MUX). The self refresh may continue until time $T_8$ when the cell blocks, master wordlines, local wordlines have been accessed and the associated memory cells have been refreshed. Thus, at time $T_8$, the CKE signal may be asserted, enabling the clock signal CLK and at time $T_9$ the self refresh signal SREF may be lowered, thereby terminating the self refresh.

For special-purpose low power DRAM devices, such as those utilized in cellular telephones and personal digital assistants (PDAs), it may be important to minimize current consumption, typically to increase battery life. As these devices often spend a large majority of their life in standby modes, requiring refresh to maintain their data (e.g., digital pictures, files, etc.), current consumption during refresh (referred to as IDD6 current) is particularly important. However, switching between local wordlines and between cell blocks as each memory cell is refreshed during self refresh operations of conventional DRAM devices typically results in additional current consumption.

For example, in some cases, a boosted voltage (e.g., a voltage boosted from a power supply voltage by a charge pump circuit, sometimes referred to as $V_{PP}$) may be used during a self refresh for wordline and row control circuits. Where current is drawn from the $V_{PP}$ source, the memory device may consume additional power to boost $V_{PP}$ to an appropriate level. During self refresh, the current drawn from $V_{PP}$ may be increased due to frequent enabling and disabling of master and local wordlines, thereby increasing the power consumption of the memory device further.

Accordingly, what is needed are memory devices and methods which reduce the amount of current consumption during refresh operations.

SUMMARY OF THE INVENTION

Embodiments of the invention provide a method and apparatus of performing a refresh. In one embodiment, a method for performing a self refresh of memory cells in a memory device is provided. The memory device includes a first group of cell blocks and a second group of cell blocks of a memory bank, each group including a plurality of memory cells. Each cell block of the first group shares at least one sense amplifier with a cell block of the second group. The method includes simultaneously activating each cell block of the first group while the cell blocks of the second group are left deactivated. Activating each cell block of the first group includes connecting the cell block of the first group to the at least one sense amplifier shared with the second group. While the cell blocks of the first group are activated and the cell blocks of the second group are deactivated, each memory cell in the first group is refreshed. The method further includes simultaneously activating each cell block of the second group while the cell blocks of the first group are left deactivated. Activating each cell block of the second group includes connecting the cell block of the second group to the at least one sense amplifier shared with the first group. While the cell blocks of the second group are activated and the cell blocks of the first group are deactivated, each memory cell in the second group is refreshed.

In one embodiment, each of the cell blocks in the first and second groups includes memory cells accessed via local wordlines driven by master wordlines. Refreshing each memory cell in the first and second groups includes (a) activating a first local wordline selection signal for each master wordline in a cell block, (b) sequentially activating each master wordline in the cell block while the first local wordline selection signal is activated, (c) refreshing each memory cell accessed the first local wordline for each master wordline in the cell block, and repeating (a)-(c) for each local wordline for each master wordline in the cell block.

One embodiment of the invention provides a method for refreshing memory cells in a memory device having alternating first cell blocks and second cell blocks. The method includes activating each of the first cell blocks during a first part of a self refresh, refreshing each row of memory cells in the first cell blocks during the first part, activating each of the second cell blocks during a second part of the self refresh, and refreshing each row of memory cells in the second cell blocks during the second part.

One embodiment of the invention provides a memory device which includes a row address counter, one or more memory banks, and control circuitry. Each memory bank includes a plurality of alternating first and second cell blocks. The control circuitry is configured to receive a self refresh command and perform a self refresh. The self refresh includes refreshing each row of memory cells in the first cell blocks when the most significant bit of the row address counter is a first value, refreshing each row of memory cells in the second cell blocks when the most significant bit of the row address counter is a second value, and incrementing the counter after each row of memory cells is refreshed.

One embodiment of the invention provides a memory device which includes a refresh circuit, one or more memory banks, wiring circuitry, and control circuitry. The refresh circuit includes a row address counter and a self refresh timer. The one or more memory banks include a plurality of alternating first and second cell blocks. The wiring circuitry is configured to receive an address provided by the row address counter from the row address multiplexer during a self refresh and output bits of the row address counter as a modified row address. The modified row address is used to refresh memory cells in the first cell blocks during a first portion of the self refresh and refresh memory cells in the second cell blocks during the second portion of the self refresh. The control circuitry is configured to perform the self refresh incrementing the counter row address counter using the self refresh timer, until each memory cell in the one or more memory banks is refreshed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide techniques and apparatus that may be utilized to reduce current consumption during a self refresh of a memory device. In one embodiment, a method for performing a self refresh of memory cells in a memory device is provided. The memory device includes a first group of cell blocks and a second group of cell blocks of a memory bank, each group including a plurality of memory cells. Each cell block of the first group shares at least one sense amplifier with a cell block of the second group. The method includes simultaneously activating each cell block of the first group while the cell blocks of the second group are left deactivated. Activating each cell block of the first group includes connecting the cell block of the first group to the at least one sense amplifier shared with the second group. While the cell blocks of the first group are activated and the cell blocks of the second group are deactivated, each memory cell in the first group is refreshed. The method further includes simultaneously activating each cell block of the second group while the cell blocks of the first group are left deactivated. Activating each cell block of the second group includes connecting the cell block of the second group to the at least one sense amplifier shared with the first group. While the cell blocks of the second group are activated and the cell blocks of the first group are deactivated, each memory cell in the second group is refreshed. In one embodiment, the cell blocks of the first group are even cell blocks and the cell blocks of the second group are odd cell blocks. By alternatively activating the first and second group of cell blocks in a memory bank during a self refresh of a memory device, power consumption caused by activation and deactivation of the cell blocks may be reduced.

In one embodiment, each of the cell blocks in the first and second groups includes memory cells accessed via local wordlines driven by master wordlines. Refreshing each memory cell in the first and second groups includes (a) activating a first local wordline selection signal for each master wordline in a cell block, (b) sequentially activating each master wordline in the cell block while the first local wordline selection signal is activated, (c) refreshing each memory cell accessed the first local wordline for each master wordline in the cell block, and repeating (a)-(c) for each local wordline for each master wordline in the cell block. By refreshing each of the memory cells accessed by the first local wordlines for each master wordline during a first part of the self refresh operation and then refreshing each of the memory cells accessed by the second local wordline during a second part of the self refresh operation (and so on), power consumption caused by frequent switching between local wordlines may be reduced.

An Exemplary Memory Device

Figure 1:
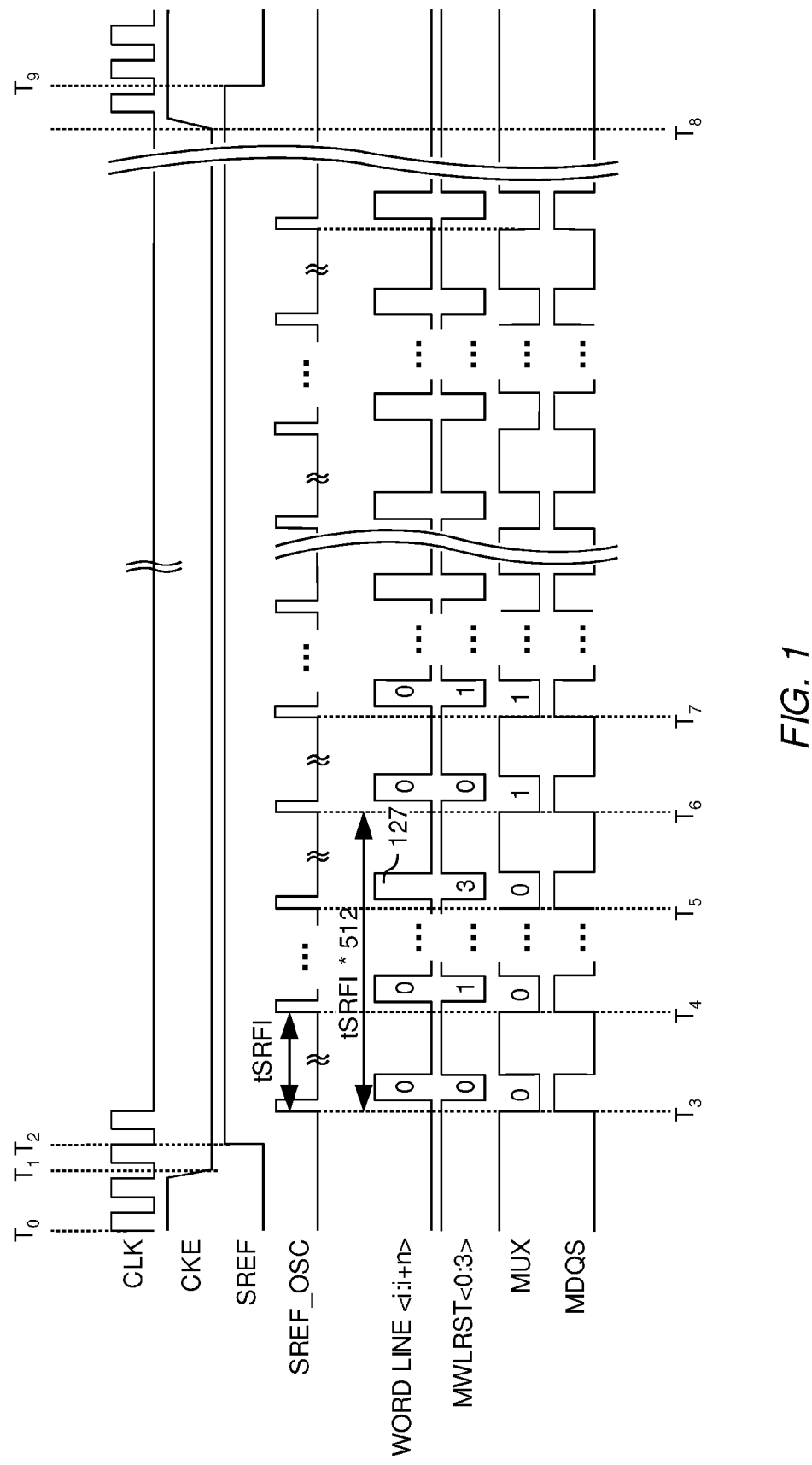
FIG. 1 is a timing diagram depicting exemplary control signals applied during a self refresh mode to a memory device having cell blocks, master wordlines, and local wordlines.
Figure 2:
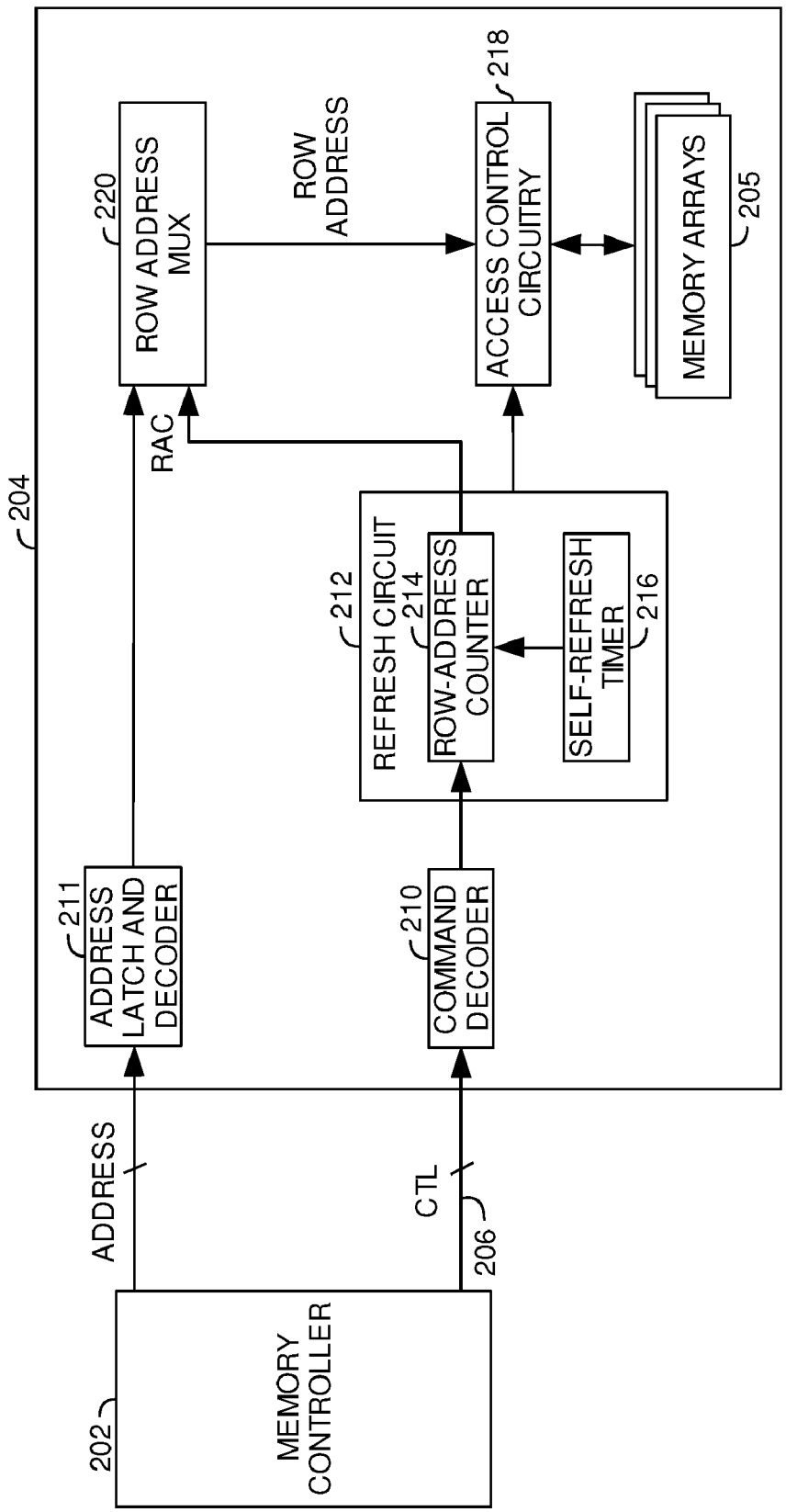
FIG. 2 is a block diagram depicting an exemplary memory device which performs refresh operations according to one embodiment of the present invention.

FIG. 2 illustrates an exemplary memory device 204 which performs refresh operations in accordance with embodiments of the present invention. As illustrated, the device 204 may include memory banks 205 and a refresh circuit 212 to refresh cells in the banks 205. In some embodiments, the memory device 204 may have a single memory bank 205.

In some cases, refresh operations for each wordline (or row) in the banks 205 may be initiated internally or externally. For example, a memory controller 202 may issue refresh commands (e.g., CBR commands), via command lines 206 interpreted by command decoder 210, to the device 204 to initiate refresh operations. Alternatively, the memory controller 202 can place the device 204 in a self-refresh mode whereby refresh operations are generated by an internal self-refresh timer 216. In either case, the particular row of cells refreshed is typically determined by a refresh address generated by a row address counter 214 that is automatically incremented with each refresh operation.

A row address multiplexer 220 may select between the row address generated by the row address counter 214 and a row address generated by an address decoder and latch circuit 211 based on an externally supplied address. In other words, the multiplexer 220 may be controlled such that the row address counter value is selected during refresh operations, while the address generated by the address decoder and latch circuit 211 will be selected during active (read/write) accesses by the memory controller 202.

Access control circuitry 218 may be generally configured to activate rows corresponding to the row address received from the row address multiplexer 220. Thus, the access control circuitry may be configured to activate and precharge wordlines in the memory arrays 205 according to embodiments of the invention.

Figure 3:
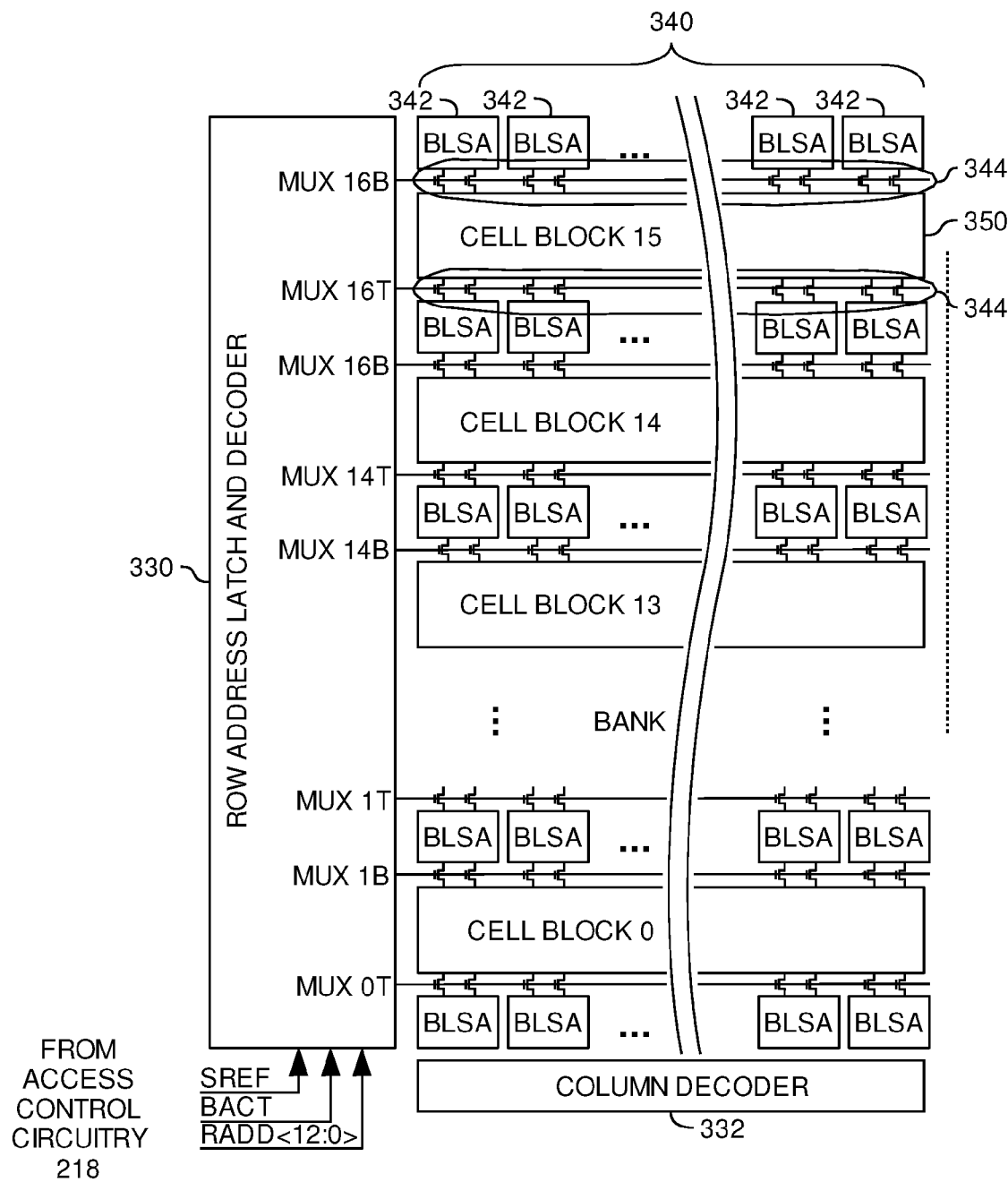
FIG. 3 is a block diagram depicting a memory bank according to one embodiment of the invention.

FIG. 3 is a block diagram depicting a memory bank 205 according to one embodiment of the invention. In the depicted embodiment, the memory bank 205 may be accessed using the row address latch and decoder 330 which receives the row address bits (RADD<12:0>) and control signals (e.g., the bank activate signal BACT and the self refresh signal SREF) from the access control circuitry 218. BACT may be used to activate the bank 205 during a self refresh and SREF may be used to cause the row address latch and decoder 330 to issue appropriate control signals during the self refresh. The memory array may also contain a column decoder 332 which may be used to select one or more bitlines in the memory bank 205 during an access of the memory bank 205.

The memory bank 205 may comprise a plurality of cell blocks 350. In the depicted memory bank 205, the memory bank 205 contains 16 cell blocks 350 (cell block 0 to cell block 15); however, embodiments of the invention may be utilized with a memory bank 205 containing any number of cell blocks 350. As depicted, each cell block 350 may share a bank 340 of bitline sense amplifiers 342 (BLSA) with an adjacent cell block. The BLSAs 342 may be used during read and refresh operations to sense and amplify data signals stored in a row of memory cells selected by master and local wordlines within the cell blocks 350.

To access a given cell block 350 (e.g., cell block 15), a group of bitline sense amp access transistors 344 above and below the cell block 350 may be activated to connect the cell block 350 to banks 340 of BLSAs 342 above and below the cell block 350. The access transistors 344 above and below the cell block 350 may be activated, for example, by asserting control signals (MUX16b and MUX15t, respectively) issued by the row address latch and decoder 330. Because each cell block 350 shares the bank 340 of BLSAs 342 with an adjacent cell block, the cell blocks that share the BLSAs 342 are not connected to the BLSAs 342 at the same time.

Figure 4:
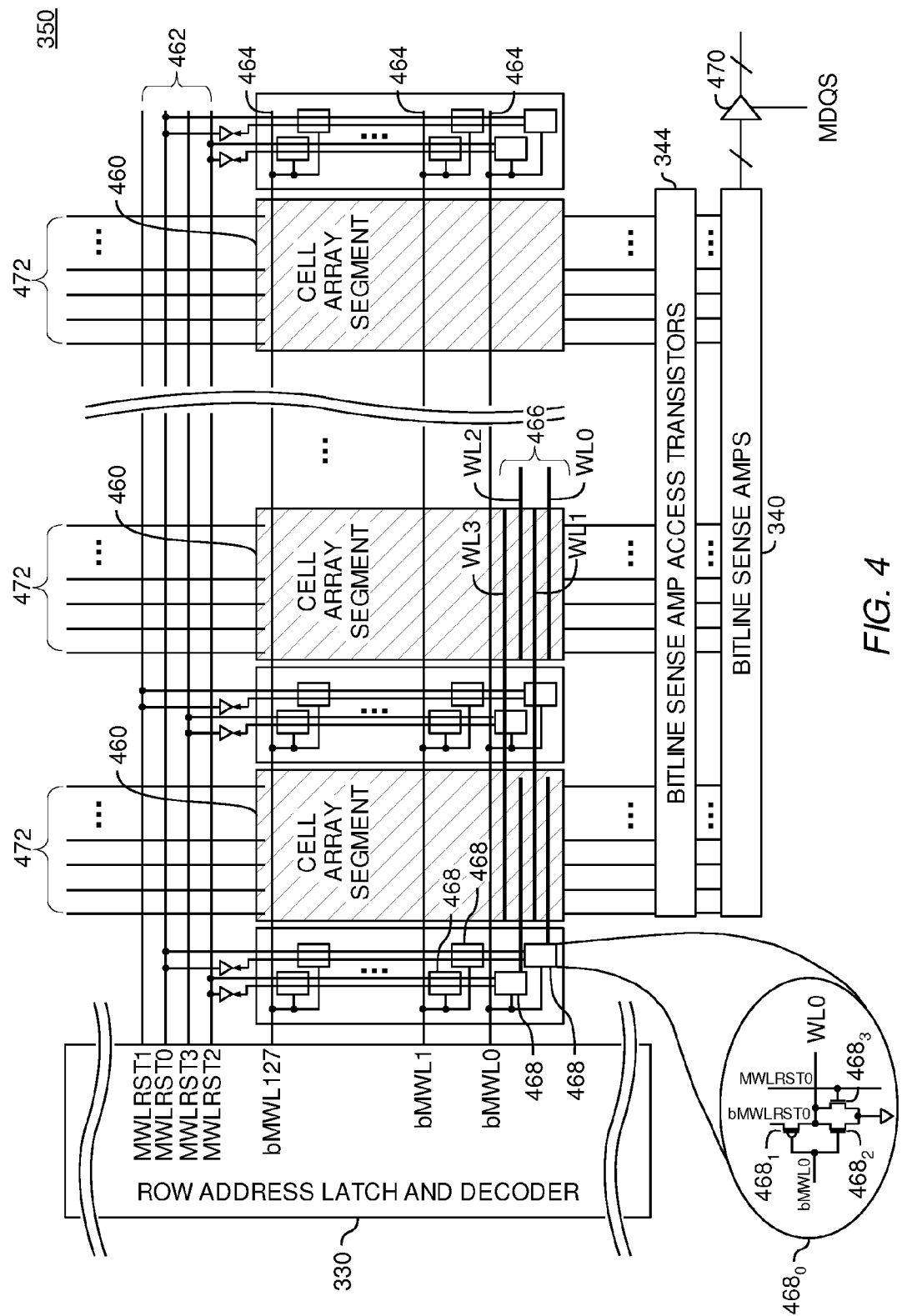
FIG. 4 is a block diagram depicting a cell block according to one embodiment of the invention.

FIG. 4 is a block diagram depicting a cell block 350 according to one embodiment of the invention. As depicted, the cell block 350 may be accessed using signals issued by the row address latch and decoder 330. The cell block 350 may contain multiple cell array segments 460. The access transistors 344 may be used to connect bitlines 472 to the bitline sense amps 340. Also, a data line bus switch 470 controlled by the MDQS signal may be used (when MDQS is asserted) to connect a local data bus line from the bitline sense amplifiers 340 to master data bus lines which are in turn connected to data (secondary) sense amplifiers.

Each row of memory cells in the cell array segment 460 may be accessed using a plurality of master wordlines 464 (bMWL<0:127>), local wordline drivers 468, local wordlines 466 and local wordline selection control lines 462 (controlled by local wordline selection signals, MWL-RST<0:3>, wherein MWLRST is activated by lowering the signal to select a given local wordline and local wordline driver). Typically, to access the memory cells for a given local wordline (e.g., WL0), the master wordline control signal bMWL0 for local wordline 0 may be lowered and the local wordline selection signal MWLRST0 for the local wordline may be lowered.

As depicted in the detailed view of local wordline driver $468_0$, lowering bMWL0 may drive the asserted signal bMWLRST0 (the compliment of MWLRST0) onto the local wordline, thereby asserting WL0 (e.g., to the wordline on voltage, VWLON, or $V_{PP}$) through PMOS transistor $468_1$ and accessing the row of memory cells associated with the local wordline WL0. If, however, either bMWL0 or MWL-RST0 for the local wordline driver $468_0$ are asserted (corresponding to the master wordline being deselected and/or the local wordline selection signal being deactivated), WL0 may be lowered by a connection to ground through NMOS transistor $468_2$ and/or NMOS transistor $468_3$, respectively, thereby deselecting WL0.

Self Refresh Operation

As mentioned above, by activating each of the, e.g., even cell blocks in a memory bank 205 during a first part of a self refresh of the memory device 204, and then activating each of the odd cell blocks in the memory device 204 during a second part of the self refresh (or vice versa), power consumption caused, for example, by frequently connecting and disconnecting cell blocks 350 to BLSAs 342 with access transistors 344, may be reduced.

For example, in a typical system, the cells blocks are refreshed in order (e.g., first, second, third, fourth, etc. . . . ). Where even and odd cell blocks (or other combinations of cell blocks, e.g., first and third cell blocks, second and fourth cell blocks, etc.) share BLSAs 342, refreshing the memory cells in the cell blocks in order may require connecting and disconnecting the cell blocks to the shared BLSAs 342 during each refresh of a cell block (e.g., after the memory cells in cell block 0 are refreshed, cell block 0 must be disconnected from the BLSAs 342 shared with cell block 1 so that the memory cells in cell block 1 may be refreshed), thereby increasing power consumption due to the connecting and disconnecting. By refreshing the memory cells in each of the even cell blocks first, and then refreshing each of the memory cells in each of the odd cell blocks at another time, the even cell blocks may each be connected to the BLSAs 342 while the memory cells in the even cells blocks are refreshed, and the odd cell blocks may each be connected to the BLSAs 342 while the memory cells in the odd cells blocks are refreshed, thereby reducing the amount of switching (and therefore power consumption) between the even and odd cell blocks and the shared BLSAs 342.

Also, by refreshing each of the memory cells accessed by first local wordlines (e.g., by local wordline WL0 of each segmented wordline) during a first part of the self refresh operation and then refreshing each of the memory cells accessed by second local wordlines (e.g., by local wordline WL1 of each segmented wordline) during a second part of the self refresh operation, power consumption caused by frequent switching between local wordlines (e.g., due to asserting and lowering MWLRST<0:3>) may be reduced. In one embodiment, to reduce power consumption further, the MDQS signal (used to connect the local data bus line from the bitline sense amplifiers 340 to master data bus lines and secondary sense amplifiers) may be held low. MDQS may be held low without affecting the refresh of the memory device because the secondary sense amplifiers and master data bus lines may not be used for a refresh. Thus, power consumption of the memory device 204 may be reduced further.

The self refresh operation is described below with respect to a memory device having 16 cell blocks, with 128 master wordlines per cell block, and four local wordlines per master wordline. Thus, to refresh all of the rows in the memory device may last for 8192 refresh cycles (16*128*4=8192, with one refresh cycle per row). However, embodiments of the invention may be used with a memory having any number of cell blocks, master wordlines, and local wordlines.

Figure 5A:
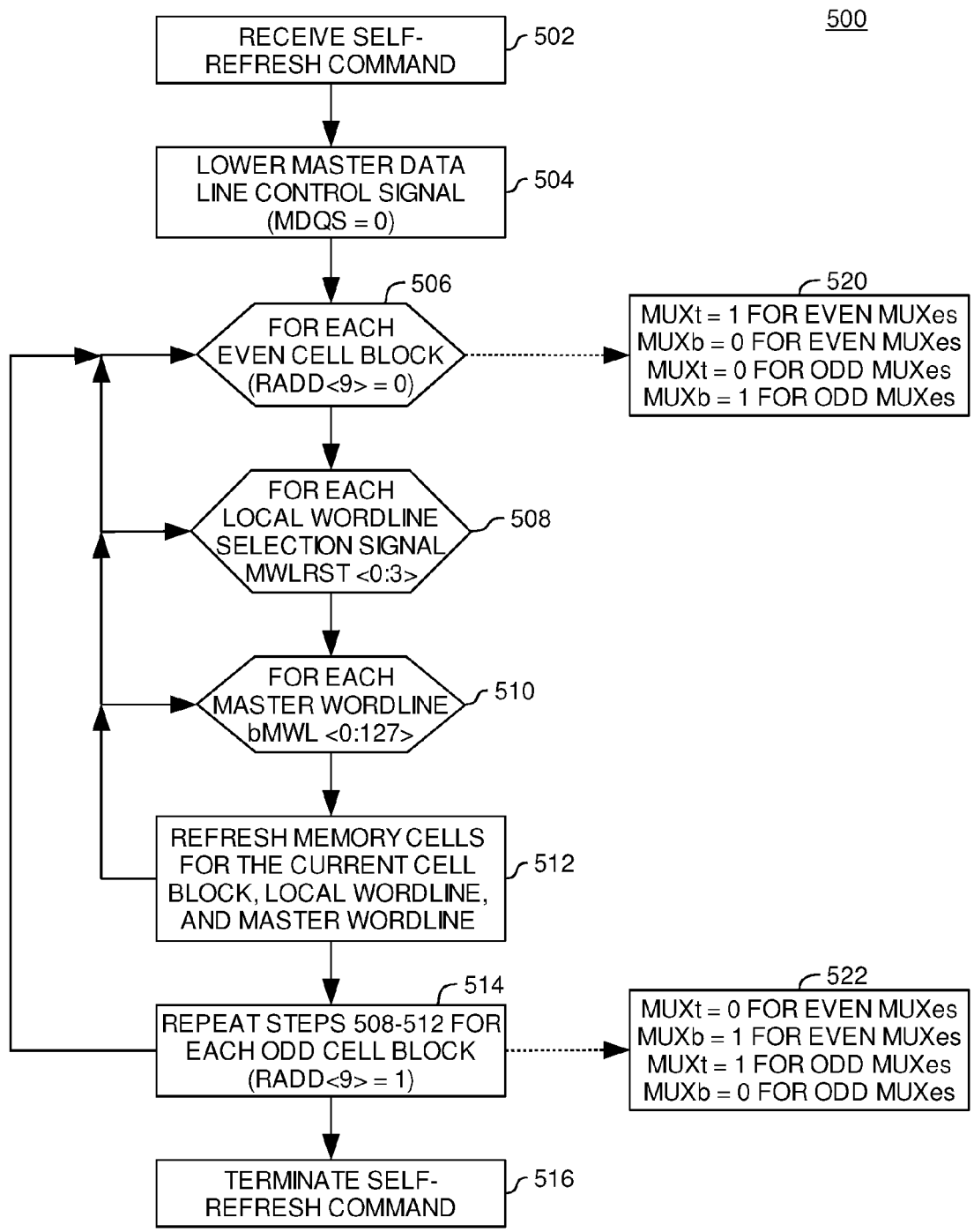
FIG. 5A is a flow diagram depicting a process for refreshing a memory device according to one embodiment of the invention.

FIG. 5A is a flow diagram depicting a process 500 for refreshing the memory device 204 according to one embodiment of the invention. The process 500 may begin at step 502 where a self refresh command SREF is received. At step 504, the master data line control signal MDQS may be lowered, and may remain low during the self refresh cycle, thereby reducing power consumption from switching data line bus switch 470.

At step 506, a loop may begin which is performed for each even cell block (e.g., cell block 0, cell block 2, cell block 4, etc.). Where the row address RADD is 13 bits and the memory bank 205 contains 16 cell blocks, the first four bits of RADD (RADD<12:9>) may designate which cell block 350 is to be precharged by the row address latch and decoder 330. Thus, row address bit RADD<9> may remain at a low logic level '0', indicating that RADD<12:9> is even, while the loop beginning at step 506 is being performed. Bits RADD<12:10> may determine which of the even cell blocks is being precharged during the loop.

Figure 5B:
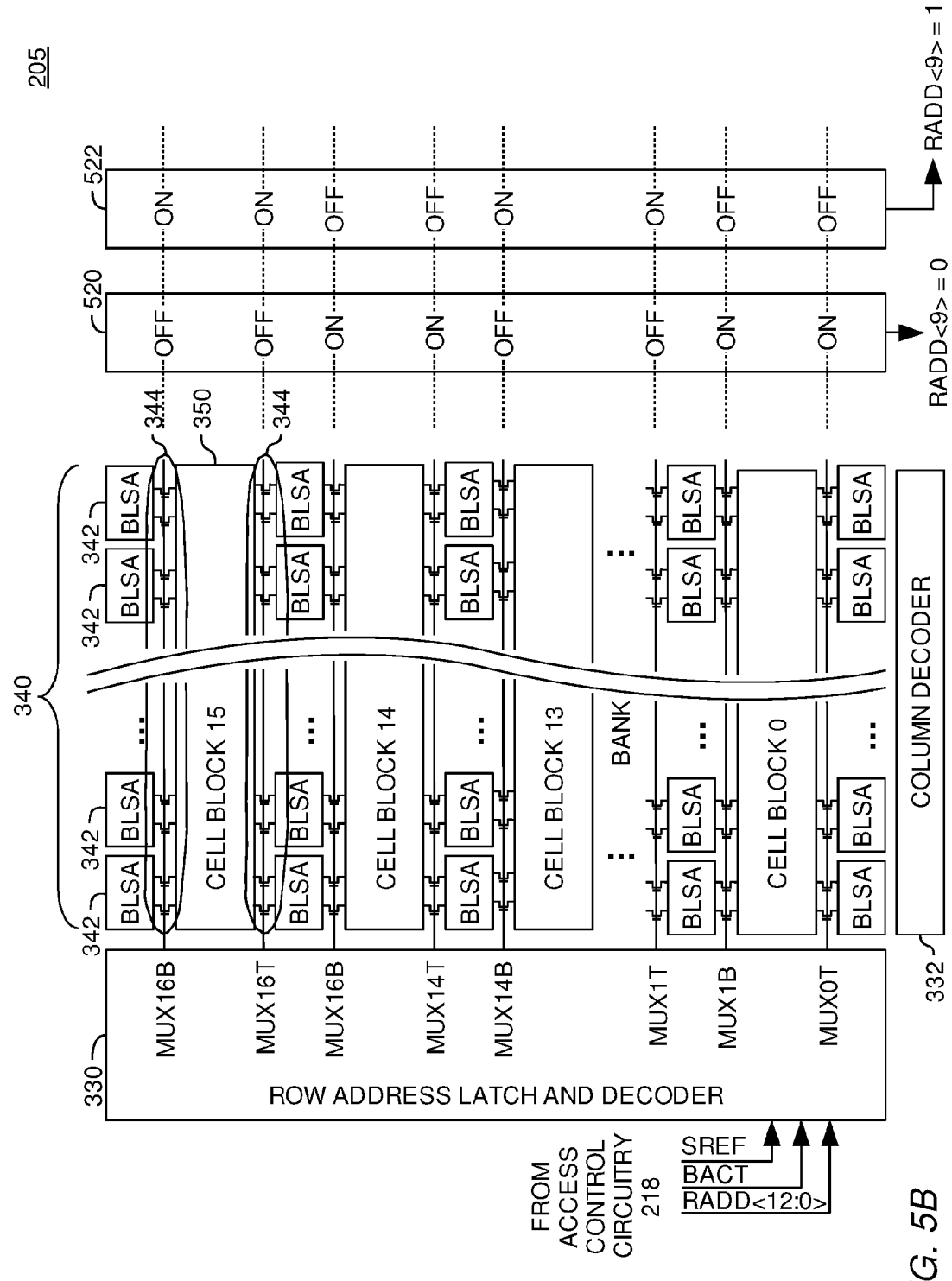
FIG. 5B is a block diagram depicting cell blocks activated during a self refresh cycle according to one embodiment of the invention.

To access each of the even cell blocks during the loop beginning at step 506, the even cell blocks may be connected to the BLSAs 342 using the access transistors 344. By connecting the even cell blocks to the BLSAs 342, the BLSAs 342 may be used to refresh the memory cells selected by the row address latch and decoder 330. As depicted in the access transistor control signal list 520, each of the MUXt signals for even MUXes and MUXb signals for odd MUXes may be asserted, while each of the MUXt signals for odd MUXes and MUXb signals for even MUXes may be lowered. Thus, as depicted in FIG. 5B, the access transistor control signals 520 may thereby connect each of the even cell blocks to the BLSAs 342.

At step 508, a loop may begin which is repeated for each local wordline selection signal within the even cell block being precharged. For example, where each master wordline 464 is used to access four local wordlines 466, each selected by activating one of the local wordline selection signals, the loop may begin with local wordline selection signal local wordline 0 and be repeated 4 times for each local wordline selection signal for local wordlines 0-3. Then, at step 510, a loop may begin which may be repeated for each of the master wordline segments bMWL<0:127>. At step 512, memory cells for the current cell block 350, local wordline 466, and master wordline 464 may be refreshed. Thus, the memory cells accessed by the first local wordline (local wordline 0) for each master wordline 464 may be refreshed first, memory cells accessed by the second local wordline for each master wordline 464 may be refreshed second, and so on, until the memory cells in a given even cell block have been refreshed. The refresh sequence in steps 508-512 may then be repeated for the next even cell block, until the memory cells in the even cell blocks have been refreshed.

After the memory cells in the even cell blocks have been refreshed, the memory cells in the odd cell blocks may be refreshed. Thus, at step 514, the steps described above (steps 508-512) may be repeated for each of the odd cell blocks (where RADD<9>=1). As depicted in the access transistor control signal list 522, each of the MUXt signals for even MUXes and MUXb signals for odd MUXes may be lowered, while each of the MUXt signals for odd MUXes and MUXb signals for even MUXes may be asserted during the refresh of the odd cell blocks. Thus, as depicted in FIG. 5B, the access transistor control signals 522 may thereby connect each of the odd cell blocks to the BLSAs 342 as the memory cells in the odd cell blocks are refreshed. After the memory cells in the even cell blocks and odd cell blocks have been refreshed, the self refresh may terminate at step 516.

Figure 5C:
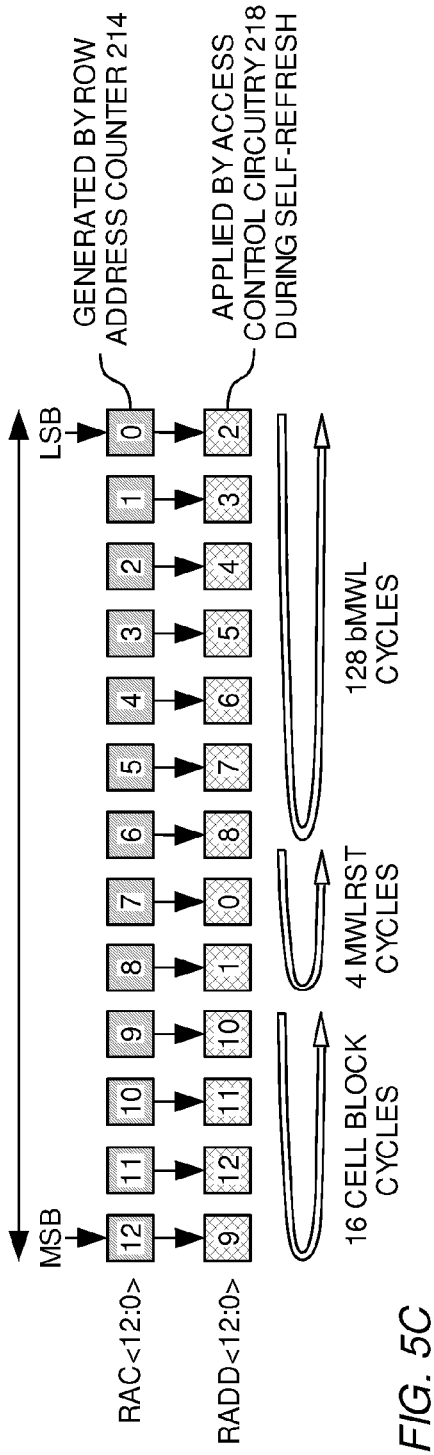
FIG. 5C is a diagram depicting signals for performing a self refresh according to one embodiment of the invention.

In one embodiment, process 500 described above with respect to FIG. 5A may be implemented using the row address counter 214 (which generates RAC<12:0>) and the access control circuitry 218. For example, the row access circuitry 218 may receive RAC<12:0> from the row address MUX 220 during self refresh and apply RADD<12:0> to the row address latch and decoder 330. FIG. 5C is a diagram depicting signals for performing a self refresh according to one embodiment of the invention.

In one embodiment, during the self refresh operation, the access control circuitry 218 may modify the order in which cell blocks 350, master wordlines 464, and local wordlines 466 are refreshed by changing which RAC bits are output as RADD bits. As depicted, the bits RADD<12:9> may be used to select one of 16 cell blocks 350 (16 cell block cycles), RADD<1:0> may be used to select one of four local wordlines 466 (4 MWLRST cycles), and RADD<8:2> may be used to select one of 128 master wordlines 464 (128 bMWL cycles).

As depicted, during the self refresh, the highest order RAC bit, RAC<12> may be output by the access control circuitry 218 as RADD<9>. When a self refresh begins, RAC<12> may, for example, be 0. RAC<12> is the highest order bit output by the row address counter 214, so RAC<12> (and thus RADD<9>) will change from 0 to 1 once, halfway through the self refresh, after 4096 refresh cycles. Because, as described above, the even cell blocks are connected to the BLSAs 342 when RADD<9> is 0 and the odd cell blocks are connected to the BLSAs 342 when RADD<9> is 1, and because RADD<9> may only change once during the self refresh, power consumption due to switching between the even and odd cell blocks may be reduced.

Similarly, during self refresh, RAC<8:7> may be applied to RADD<1:0> and RAC<6:0> may be applied to RADD<8:2>. By applying the higher order bits RAC<8:7> (which are incremented every 128 cycles) to RADD<1:0>, and by applying RAC<6:0> to RADD<8:2>, a local wordline 466 selected by RADD<1:0> may remain enabled while each of the 128 master wordlines 464 (selected by RADD<8:2>) in the selected cell block 350 are sequentially asserted using RAC<6:0> (the lower order bits of RAC). Thus, the memory cells accessed by a respective local wordline for each of the 128 master wordlines 464 may be refreshed. After the 128 master wordlines 464 have been asserted, RADD<1:0> may be incremented, and the self refresh may continue with the next local wordline 464 for each of the 128 master wordlines 464. Thus, the frequency of switching between local wordlines and the resulting power consumption may be reduced.

Figure 5D:
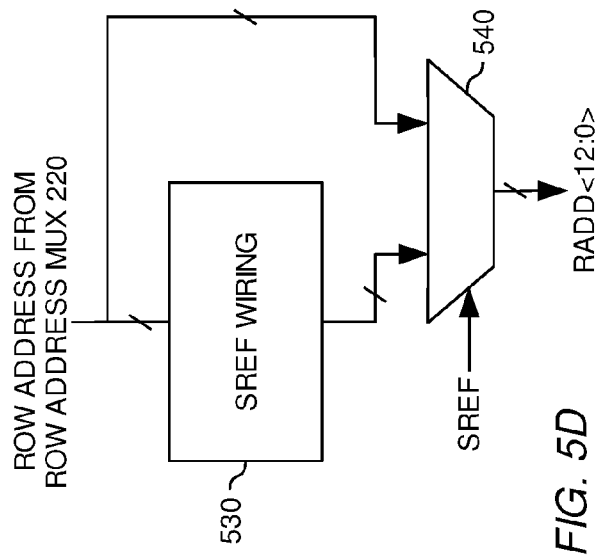
FIG. 5D is a block diagram depicting circuitry configured to row address bits during a self refresh according to one embodiment of the invention.

FIG. 5D is a block diagram depicting circuitry configured to generate the RADD<12:0> bits from RAC<12:0> during a self refresh of the memory device 204 according to one embodiment of the invention. In one embodiment, the depicted circuitry may be contained within the access control circuitry 218. Optionally, the circuitry may be contained in the row address MUX 220, the row address latch and decoder 330, or any other convenient place within the memory device 204.

As depicted, the circuitry may include self refresh wiring (SREF wiring 530) and a MUX 540 controlled by the self refresh signal SREF. During regular operations of the memory device 204, the SREF signal may select the row address from the row address MUX 220 to be output by the MUX 540. For example, the row address output by the MUX 220 may be an address applied to the memory device 204 by the memory controller 202. During a self refresh, the SREF signal may select a row address output by the SREF wiring 530. The SREF wiring 530 may connect RAC<12:0> to RADD<12:0> as depicted in FIG. 5C and described above. Thus, the circuitry depicted in FIG. 5D may be used to select a normal address to be accessed or a modified (rewired) address to be refreshed during a self-refresh.

Figure 6:
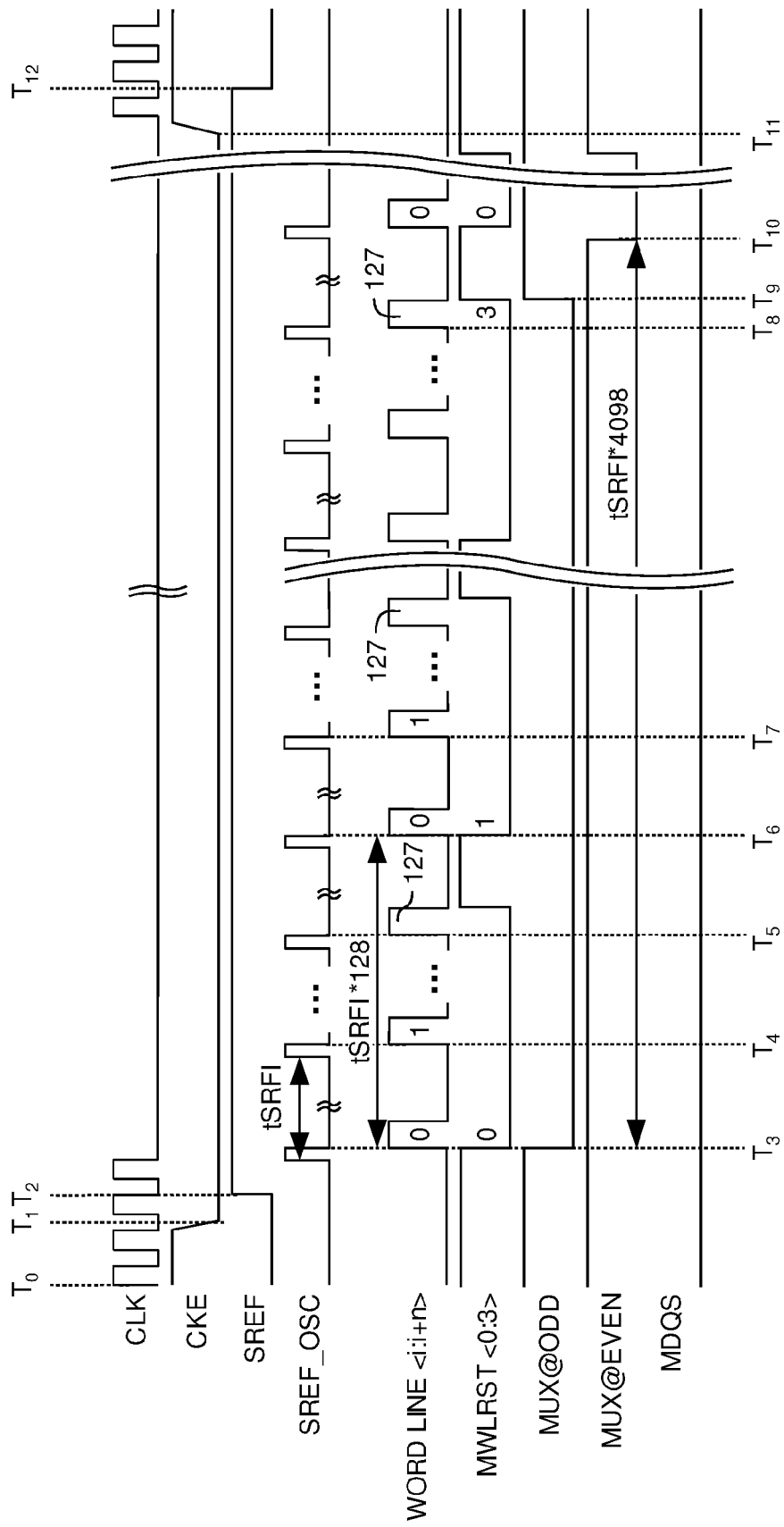
FIG. 6 is a timing diagram depicting control signals applied during a self refresh mode according to one embodiment of the invention.

FIG. 6 is a timing diagram depicting control signals applied during a self refresh mode according to one embodiment of the invention. At time $T_0$, the memory device may be operating in a normal mode wherein requested memory accesses (reads, writes, and refreshes) are being performed. As described above, at time $T_1$, the clock enable signal CKE may be lowered, thereby disabling the clock signal CLK. At time $T_2$, a self refresh of the memory device may be initiated by an external self refresh command and the self refresh signal SREF may be asserted. During the self refresh, the MDQS signal may remain low.

When the self refresh begins at time $T_3$, RAC may be 0 (RAC<12:0>=0), for example. Thus, the memory cells accessed using local wordline 0 and master wordline 0 in cell block 0 may be refreshed during the first cycle. As depicted, the MUX signals which connect the even cell blocks to the BLSAs 342 may also be asserted, while the MUX signals which connect the odd cell blocks to the BLSAs 342 may be lowered.

At time $T_4$, the memory cells accessed by local wordline 0 and master wordline 1 are refreshed during the second cycle. The refresh of each of the memory cells accessed by local wordline 0 (MWLRST=0) of each master wordline 464 may continue for 128 refresh cycles (tSRFI*128) until time $T_6$ when each of the memory cells accessed by local wordline 0 of each segmented wordline have been refreshed. At time $T_7$, the self refresh may continue with local wordline 1 (MWLRST=1) for each of the main wordlines 464.

At time $T_8$, the memory cells accessed by local wordline 3 and master wordline 127 in cell block 14 may be refreshed. After the refresh cycle at time $T_8$, each of the memory cells in the even cell blocks have been refreshed. As described above, refreshing the even cell blocks may last for half of the self refresh, or 4096 self refresh cycles. Then, at time $T_9$, the MUX signals which connect the odd cell blocks to the BLSAs 342 may be asserted, and at time $T_{10}$, the MUX signals which connect the even cell blocks to the BLSAs 342 may be lowered. Thus, at time $T_{10}$, the self refresh may continue by refreshing the memory cells in each of the odd cell blocks as described above.

The self refresh of each of the odd cell blocks may continue until time $T_{11}$ when the cell blocks, master wordlines, local wordlines in the memory device 204 have been accessed and the associated memory cells have been refreshed. Thus, at time $T_{11}$, the CKE signal may be asserted, enabling the clock signal CLK and at time $T_{12}$ the self refresh signal SREF may be lowered, thereby terminating the self refresh.

Further Exemplary Embodiments

As described above, embodiments of the invention may be utilized with a memory device having any number of memory banks, cell blocks, master wordlines, and local wordlines. Also, in some cases, embodiments of the invention (e.g., switching between even and odd cell blocks) may be used in memory devices which do not utilize segmented wordlines (e.g., memory devices which do not contain master and local wordlines). For example, embodiments of the invention may be used with a memory device which utilizes stitched wordlines.

In one embodiment, activating a local wordline selection signal while switching between master wordlines during a self refresh may require a longer precharge time (referred to as $T_{RP}$) than during normal access operations, for example, because MWLRST may not be changed during the self refresh cycle. Accordingly, in some cases, the precharge time (and thus tSRFI) may be increased during a self refresh.

In some cases, the memory device may utilize redundant wordlines. Redundant wordlines may be used to repair defects in the memory device. For example, during a test of the memory device, a defect, such as a short between a local wordline and a bitline may be detected. Upon detecting the defective local wordline, a redundant wordlines (e.g., another master wordline and/or local wordline) may be used to replace the defective wordline. The address of the defective wordline and redundant wordline may be recorded, e.g., by blowing one or more fuses in the memory device. Each time an attempt is made to access the defective wordline, the recorded address may be used (e.g., by the access control circuitry or row address latch and decoder) to access the redundant wordline instead, thereby allowing the redundant wordline to replace the defective wordline.

Where the redundant wordline is located in an even cell block and the defective wordline is located in an odd cell block (or vice versa), performing a refresh of the even cell block containing the defective wordline may cause the odd cell block to be accessed, e.g., when the defective wordline address is being refreshed. By accessing the odd cell block during the portion of the self refresh in which the even cell blocks are being refreshed, the power consumption of the memory device may be increased, e.g., due to switching between the even and odd cell blocks.

Accordingly, in one embodiment, to reduce switching between even and odd cell blocks caused by accessing a redundant wordline, defective wordlines in an even cell blocks may only be replaced with redundant wordlines in even cell blocks and defective wordlines in odd cell blocks may only be replaced with redundant wordlines in odd cell blocks. Thus, each time a redundant wordline is accessed instead of a defective wordline, there may be no switching between even and odd cell blocks, thereby reducing the power consumption of the memory device during the self refresh. Where embodiments of the invention are utilized with mobile DRAM devices which may have short bitlines and more cell blocks in each memory bank, more options for placing redundant wordlines may be available, thereby facilitating selection of an appropriate redundant wordline.

In some cases, the methods of refreshing a memory device described herein may only be applied to the memory device when the memory device is paced in a low power mode, e.g., by issuing a command to the memory device or setting a bit in a mode register of the memory device. When the memory device is not operating in the low power mode, a traditional self refresh may be utilized. Furthermore, in some cases, the self refreshes performed according to embodiments described herein may be performed with some instructions of the memory device (e.g., an SREF command) but not with other instructions of the memory device (e.g., a traditional refresh may be performed using other commands, such as the CBR command). Optionally, self refreshes as described herein may be used with both commands.

CONCLUSION

As described above, by activating each of the even cell blocks in a memory bank during a first part of a self refresh of the memory device, and then activating each of the odd cell blocks in the memory device during a second part of the self refresh (or vice versa), power consumption caused, for example, by connecting and disconnecting cell blocks bitline sense amplifiers, may be reduced. Also, by refreshing each of the memory cells accessed by first local wordlines during a first part of the self refresh operation and then refreshing each of the memory cells accessed by second local wordlines during a second part of the self refresh operation, power consumption caused by frequent switching between local wordlines may be further reduced.

While the foregoing is directed to embodiments of the present invention, other and further embodiments of the invention may be devised without departing from the basic scope thereof, and the scope thereof is determined by the claims that follow.

What is claimed is:

1. A memory device comprising:
    a memory bank;
    a first group of cell blocks in the memory bank;
    a second group of cell blocks in the memory bank, wherein each cell block of the first group shares at least one sense amplifier with a cell block of the second group; and
    control circuitry configured to:
        simultaneously activate each cell block of the first group while the cell blocks of the second group are left deactivated, wherein activating each cell block of the first group comprises connecting the cell block of the first group to the at least one sense amplifier shared with the second group;
        while the cell blocks of the first group are activated and the cell blocks of the second group are deactivated, refresh each memory cell in the first group;
        simultaneously activate each cell block of the second group while the cell blocks of the first group are left deactivated, wherein activating each cell block of the second group comprises connecting the cell block of the second group to the at least one sense amplifier shared with the first group; and
        while the cell blocks of the second group are activated and the cell blocks of the first group are deactivated, refresh each memory cell in the second group.

2. The memory device of claim 1, wherein each of the cell blocks in the first and second groups comprises memory cells accessed via local wordlines driven by master wordlines, and wherein refreshing each memory cell in the first and second groups comprises:
    (a) activating a first local wordline selection signal for each master wordline in a cell block;
    (b) sequentially activating each master wordline in the cell block while the first local wordline selection signal is activated;
    (c) refreshing each memory cell accessed the first local wordline for each master word line in the cell block; and repeating (a)-(c) for each local wordline for each master wordline in the cell block.

3. The memory device of claim 1, wherein a precharge period during the self refresh is increased with respect to a precharge period during a read or write of the memory device.

4. The memory device of claim 1, further comprising:
a data sense amplifier, wherein a signal used to connect the at least one sense amplifier with the data sense amplifier is lowered during a self refresh.

5. The memory device of claim 1, further comprising:
a first access transistor between a bitline of the cell block of the first group and the at least one sense amplifier, wherein connecting each cell block of the first group to the at least one sense amplifier comprises asserting a first signal which activates the first access transistor; and
a second access transistor between a bitline of the cell block of the second group and the at least one sense amplifier, wherein connecting the each cell block of the second group to the at least one sense amplifier comprises asserting a second signal which activates the second access transistor.

6. A memory device comprising:
a means for banking memory;
a first group of cell blocks in the means for banking memory;
a second group of cell blocks in the means for banking memory, wherein each cell block of the first group shares at least one means for sensing with a cell block of the second group; and
means for controlling configured to:
simultaneously activate each cell block of the first group while the cell blocks of the second group are left deactivated, wherein activating each cell block of the first group comprises connecting the cell block of the first group to the at least one means for sensing shared with the second group;
while the cell blocks of the first group are activated and the cell blocks of the second group are deactivated, refresh each means for storing in the first group;
simultaneously activate each cell block of the second group while the cell blocks of the first group are left deactivated, wherein activating each cell block of the second group comprises connecting the cell block of the second group to the at least one means for sensing shared with the first group; and
while the cell blocks of the second group are activated and the cell blocks of the first group are deactivated, refresh each means for storing in the second group.

7. The memory device of claim 6, wherein each of the cell blocks in the first and second groups comprises means for storing accessed via local wordlines driven by master wordlines, and wherein refreshing each means for storing in the first and second groups comprises:
(a) activating a first local wordline selection signal for each master wordline in a cell block;
(b) sequentially activating each master wordline in the cell block while the first local wordline selection signal is activated;
(c) refreshing each means for storing accessed the first local wordline for each master word line in the cell block; and
repeating (a)-(c) for each local wordline for each master wordline in the cell block.

8. The memory device of claim 6, wherein a precharge period during the self refresh is increased with respect to a precharge period during a read or write of the memory device.

9. The memory device of claim 6, further comprising:
a data means for sensing, wherein a signal used to connect the at least one means for sensing with the data means for sensing is lowered during a self refresh.

10. The memory device of claim 6, further comprising:
a first means for accessing located between a bitline of the cell block of the first group and the at least one means for sensing, wherein connecting each cell block of the first group to the at least one means for sensing comprises asserting a first signal which activates the first means for accessing; and
a second means for accessing located between a bitline of the cell block of the second group and the at least one means for sensing, wherein connecting the each cell block of the second group to the at least one means for sensing comprises asserting a second signal which activates the second means for accessing.

11. A memory device comprising:
a row address counter;
one or more memory banks, wherein each memory bank comprises a plurality of alternating first and second cell blocks; and
control circuitry configured to:
receive a self refresh command;
perform a self refresh comprising:
refreshing each row of memory cells in the first cell blocks when a most significant bit of the row address counter is a first value;
refreshing each row of memory cells in the second cell blocks when the most significant bit of the row address counter is a second value; and
incrementing the counter after each row of memory cells is refreshed.

12. The memory device of claim 11, wherein each row of memory cells comprises memory cells accessed via local wordlines driven by master wordlines, and wherein the access control circuitry is further configured to:
(a) activate a first local wordline selection signal for each master wordline in a cell block;
(b) sequentially activate each master wordline in the cell block while the first local wordline selection signal is activated;
(c) refresh each memory cell accessed the first local wordline for each master wordline in a cell block; and
repeat (a)-(c) for each local wordline for each master wordline in the cell block.

13. The memory device of claim 11, wherein each first cell block and each second cell block share a bitline sense amplifier with an adjacent second cell block and first cell block, respectively.

14. The memory device of claim 13, wherein the access control circuitry is configured to:
connect each of the first cell blocks to the shared bitline sense amplifier when the most significant bit of the row address counter is the first value; and
connect each of the second cell blocks to the shared bitline sense amplifier when the most significant bit of the row address counter is the second value.

15. The memory device of claim 11, further comprising:
circuitry configured to:
determine if a cell block contains a defective wordline;

if the cell block is one of the first cell blocks, replace the defective wordline with a redundant wordline in another one of the first cell blocks; and if the cell block is one of the second cell blocks, replace the defective wordline with a redundant wordline in another one of the second cell blocks.

16. A memory device comprising:

a refresh circuit comprising a row address counter and a self refresh timer;

one or more memory banks, wherein each memory bank comprises a plurality of alternating first and second cell blocks;

wiring circuitry configured to:
  receive an address provided by the row address counter from the row address multiplexer during a self refresh; and
  output bits of the row address counter as a modified row address, wherein the modified row address is used to refresh memory cells in the first cell blocks during a first portion of the self refresh and refresh memory cells in the second cell blocks during the second portion of the self refresh; and control circuitry configured to perform the self refresh by:
  incrementing the counter row address counter using the self refresh timer, until each memory cell in the one or more memory banks is refreshed.

17. The memory device of claim 16, wherein the modified row address is further configured to:

(a) activate a first local wordline selection signal for each master wordline in a cell block;

(b) sequentially activate each master wordline in the cell block while the first local wordline selection signal is activated;

(c) refresh each memory cell accessed the first local wordline for each master wordline in a cell block; and repeat (a)-(c) for each local wordline for each master wordline in the cell block.

* * * * *